US006104263A

United States Patent [19]

Bickford

[11] Patent Number: 6,104,263

[45] Date of Patent: Aug. 15, 2000

[54] CAPACITIVE TUNING SCREW HAVING A COMPRESSIBLE TIP

[75] Inventor: Joel D. Bickford, Santa Rosa, Calif.

[73] Assignee: Hewlett-Packard Company, Palo Alto, Calif.

[21] Appl. No.: 08/864,293

[22] Filed: May 28, 1997

[51] Int. Cl.[7] .......... H03J 1/06

[52] U.S. Cl. .......... 333/232; 333/235

[58] Field of Search .......... 333/232, 231, 333/235

[56] References Cited

U.S. PATENT DOCUMENTS

| | | | |
|---|---|---|---|
| 3,252,115 | 5/1966 | Gordon | 333/232 |
| 4,035,749 | 7/1977 | Slocum et al. | 333/232 |
| 4,376,923 | 3/1983 | Curtinot et al. | 333/232 |
| 4,647,883 | 3/1987 | Oxley | 333/232 X |
| 4,677,403 | 6/1987 | Kich | 333/232 X |

*Primary Examiner*—Benny T. Lee

[57] ABSTRACT

A tuning screw with a slotted tip suited for microwave and millimeter wave applications. The slotted tip provides compression upon insertion into the conductive device and the spring character of the screw tip fingers press against the conductor walls ensuring good electrical connection.

8 Claims, 4 Drawing Sheets

CAPACITIVE TUNING SCREW HAVING A COMPRESSIBLE TIP

This invention relates to an element useful in tuning circuit devices. Most particularly, this invention relates to tuning screws useful in tuning microwave and millimeter wave components.

BACKGROUND OF THE INVENTION

Tuning screws are commonly used to tune high frequency circuits. To properly tuned high frequency circuits, the screw tip must provide a capacitive area which is small relative to the signal's wavelength. If this condition is met, the tuning screw helps to create a more uniform characteristic impedance over the signal path. Tuning screws are useful to compensate for conductors with an inductive section (i.e. a section lacking capacitance) due to missing material. An inductive section causes signal reflection and interrupts smooth signal flow. Reflections off the junction of conductors can be controlled by adding capacitance to the inductive section. Tuning screws with a tip diameter that is small relative to the wavelength of the signal help to eliminate reflections by creating a more uniform characteristic impedance over the signal path (see FIG. 1, which shows a prior art tuning screw inserted into an electrically conductive block as described above).

However, special challenges are encountered in using screws to tune circuits which operate at frequencies of greater than 50 GHz. The diameter of the screw must be small relative to the wavelength. At 50 GHz, a tuning screw diameter needs to be quite small. Tapping threads into a conductor with a diameter smaller than 1 millimeter becomes very expensive. Not only are the taps specially small, which can add to the cost, but they tend to break off during the tapping process, rendering the tap and the component useless. The parts cost rises as conductors with broken taps must be discarded or reworked. Moreover, the cost of making screws of small diameter and successfully inserting the screw into the conductor rises, again due to breaking of screws in the process and shearing off of screw heads during adjusting. Further, vibration and temperature cycling of the circuit tends to move the tuning screw from fine adjustment. This vibration induced screw movement has a serious impact on instrument performance.

What is needed is a tuning screw for microwave and millimeter wave components that provides a screw tip diameter that is small relative to the signal wavelength. What is further needed is a tuning screw that resists displacement from a tuned position, without external fixitives.

SUMMARY OF THE INVENTION

The invention provides a device for tuning microwave and millimeter wave circuits. The invention further provides a method for providing adjustable capacitance in microwave and millimeter wave circuits. The invention further provides a tuning screw suitable for tuning microwave and millimeter wave circuits. The invention further provides a self locking tuning screw suitable for tuning microwave and millimeter wave devices.

DETAILED DESCRIPTION OF A PREFERRED EMBODIMENT

Figure 1:
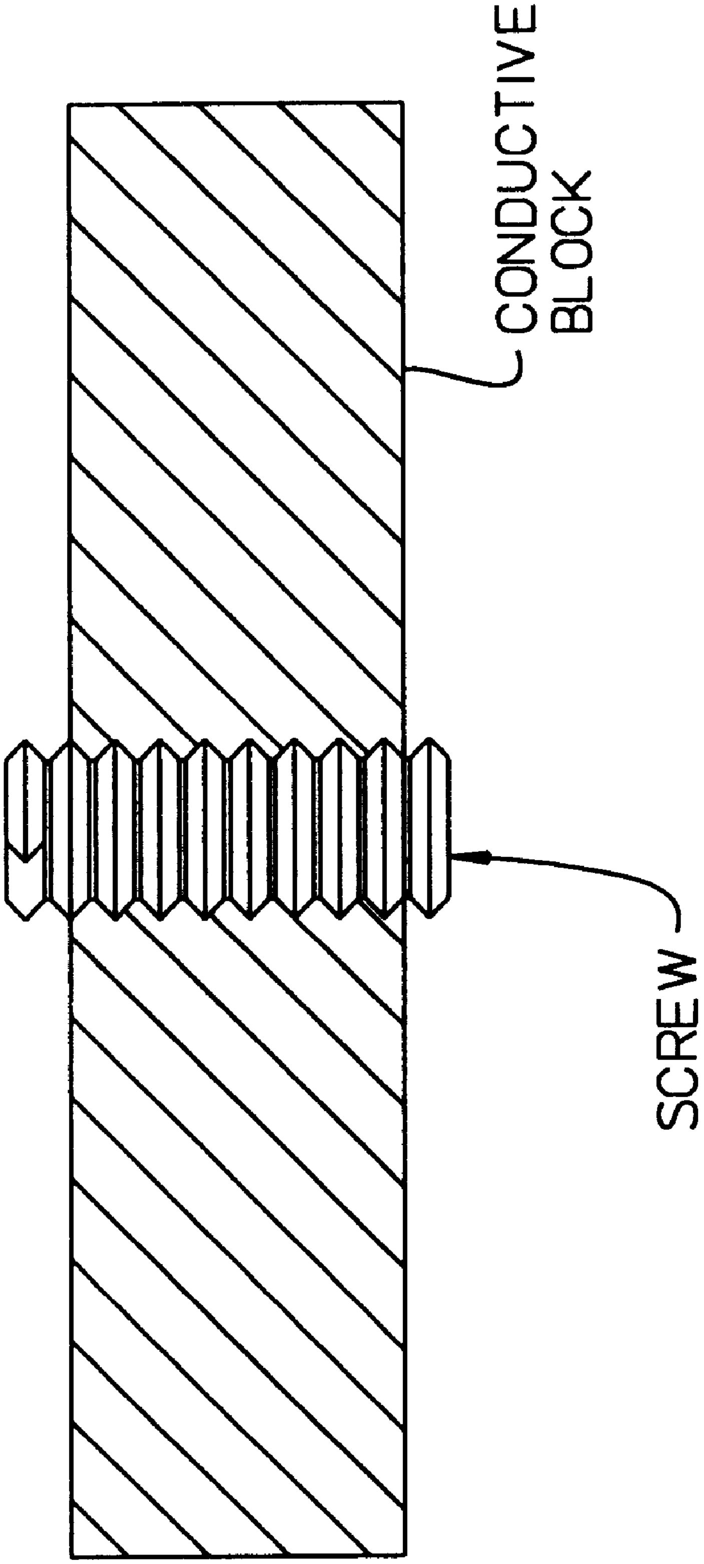
Figure 1 (PRIOR ART)
FIG. 1 is a side view of a prior art tuning screw inserted into an electrically conductive block FIGS. 2A, 2B, 2C inclusive provide top side and bottom views of a tuning screw according to the invention.
Figure 2A:
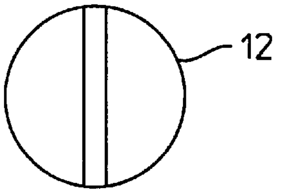
Figure 2B:
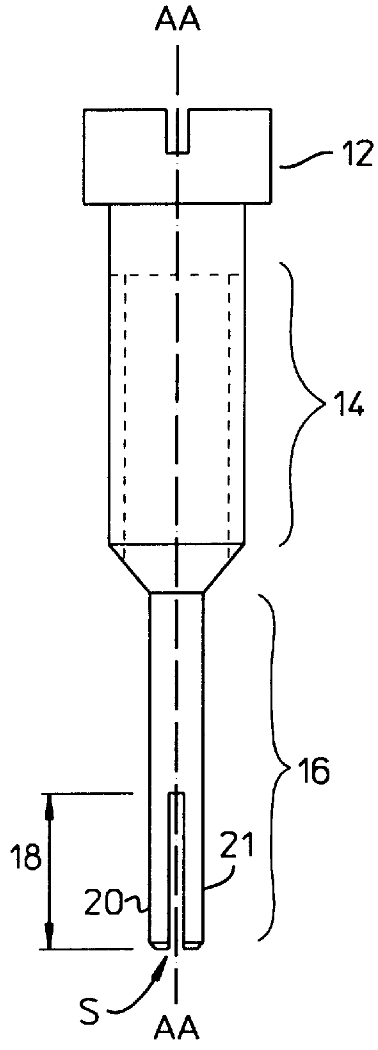
Figure 2C:
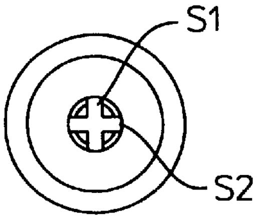

Referring now to FIGS. 2A, 2B and 2C, there is shown a cross section of a tuning screw according to the invention. As seen in FIG. 2B the screw exhibits a head end 12 (see also FIG. 2A), a threaded portion 14 extending from said head end and a tip 16 end distal to said head end 12 and extending from said threaded portion 14, the head 12, threaded portion 14 and tip 16 arranged along a common longitudinal axis AA. The tip 16 portion is further characterized by a terminal slotted region 18 having at least one longitudinal slot S and two terminal fingers 20, 21 formed thereby. FIG. 2C shows the preferred embodiment of two slots S1, S2 at substantially right angles to each other.

Figure 3:
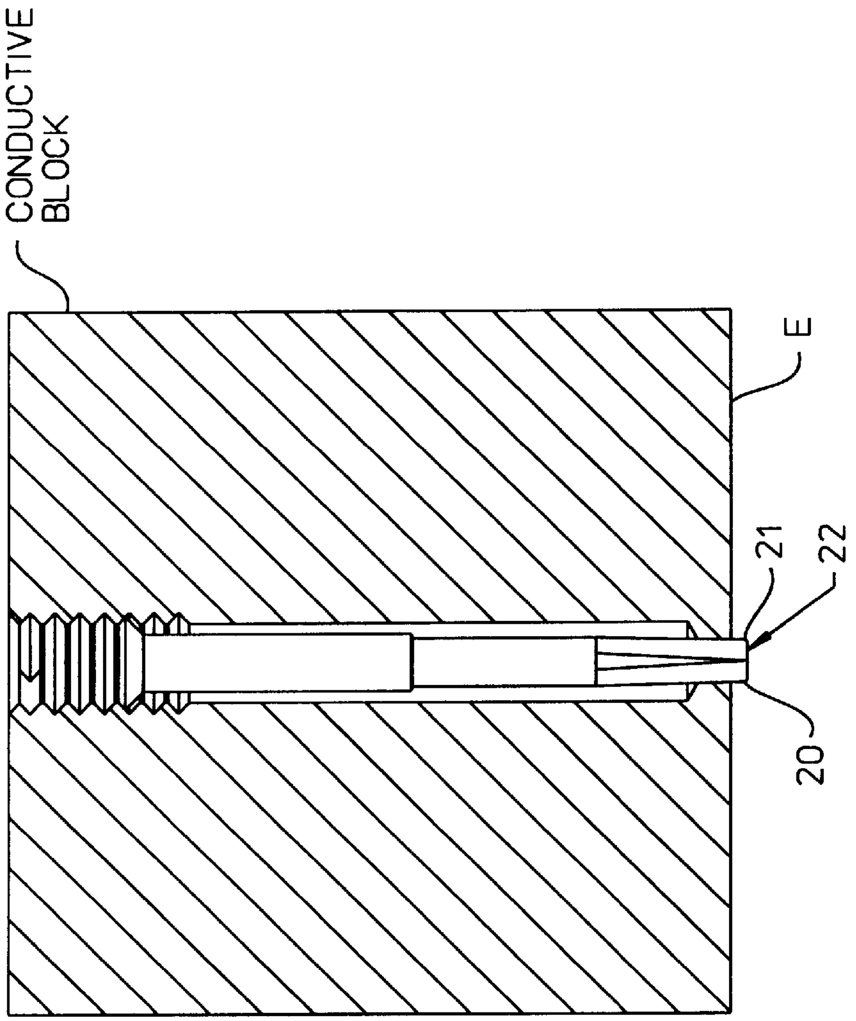
FIG. 3 is a cross sectional view of a tuning screw as taught herein in a conductive block

FIG. 3 illustrates a cross section of the inventive screw inserted within a conductive block. The two terminal fingers 20, 21 extend beyond the lateral edge E of the conductive block after passing through an aperture of smaller diameter than the tip diameter. The two fingers 20, 21 are pressed together and form a tip surface 22 the diameter of which is relatively small in comparison with the intended signal wavelength of the microwave or millimeter wave device. The outside surface of the tip fingers is in close contact with the face surface of the conductor block owing to the spring properties of the fingers. The preferred embodiment includes two slots at substantially right angle, creating thereby four terminal fingers, although two ore not shown in the cross section.

The tuning screw material needs to be selected according to and in consideration of the properties necessary for the screw. The resistance to deformation (spring) is important to keeping good electrical contact. Materials such a heat treated beryllium copper provide the requisite hardness coupled with ease of machining. Persons familiar with materials science may select additional materials suitable for the invention taught herein.

Some typical dimensions of a tuning screw for 100 GHz applications: threads, 1 mm in diameter; tip (when fingers are pressed together as shown by the lower arrows in FIG. 3) 0.33 mm in diameter. Size variations and relative dimensions depend on the wavelength application. The use of slots to alter the tip of the tuning screw enables significantly smaller tip diameters at economical production costs than have heretofore been available.

Figure 4:
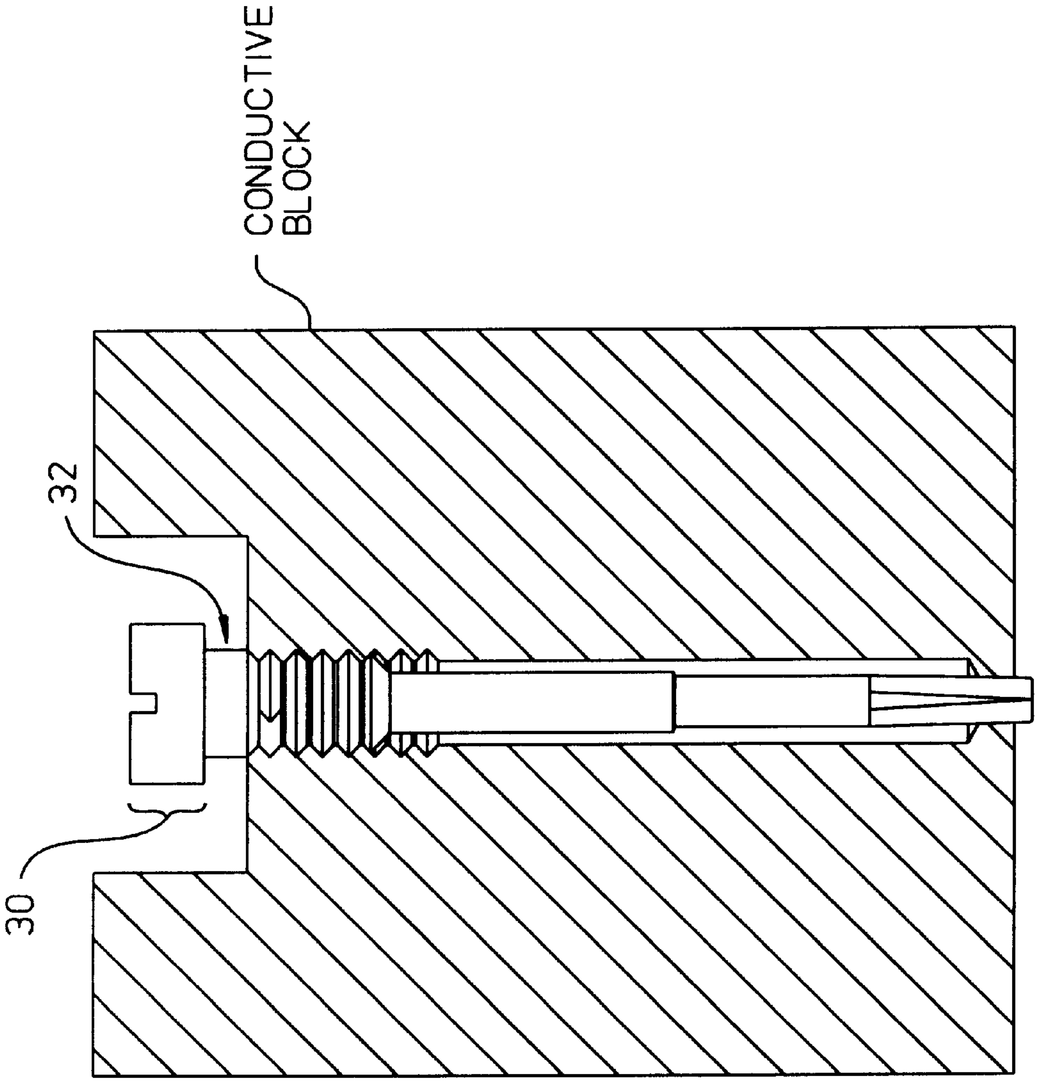
FIG. 4 is a cross section of a tuning screw according to the invention

As depicted in FIG. 4, the preferred embodiment includes a thickened head region 30 relative to the diameter of the threads. The added material aids in preventing the shearing of the head material from the screw body. In applications where protrusion of the screw tip must be controlled, depth limiters (not shown) may be added to the region beneath the head 32.

It is to be understood that the embodiments described herein are merely exemplary and that a person skilled in the art may make many variations and modifications to the described embodiments utilizing functionally equivalent components, dimensions and materials. All such variations and modifications are intended to be included within the scope of this invention as defined by the appended claims.

I claim:

1. A tuning screw comprising:

a head end and a tip end, said head end and said tip end connected by a threaded middle portion having a certain diameter, said head end, said tip end and said middle portion sharing a common longitudinal axis;

said tip end characterized by tip material surrounding at least one longitudinal slot having at least two terminal fingers, said slot being of a depth sufficient to permit narrowing of the slot such that a tip end diameter is provided when said two fingers are pressed together, and said depth of said slot being such that the tip material retains sufficient resiliency so as to act as a spring against surfaces external to and in contact with an external lateral surface of the tip material.

2. The tuning screw as in claim 1 further comprising:

said head end characterized by a thickened base portion relative to the diameter of said threaded portion, said thickened base portion adding mass sufficient to resist shearing of the head material from the threaded middle portion.

3. The tuning screw as in claim 1 wherein the at least one longitudinal slot comprises two longitudinal slots which are oriented at right angles with respect to one another.

4. A tuning screw comprising:

a head area, said head area providing a means for turning said tuning screw; a threaded portion extending below said head area along a common longitudinal axis, said threaded portion having a diameter no greater than a diameter associated with the head area, a shaft portion extending below said threaded portion along a common longitudinal axis;

a tip portion extending below said shaft portion along a longitudinal axis, said tip portion comprising:

a length of said shaft portion terminating in the tip of the screw wherein the end of the tip exhibits two slits substantially at right angles to each other, said two slits thereby creating four proximal tip extensions, said tip extensions of such a length to permit compression to thereby provide a substantially closed-slit tip when compressed together, and to preserve springy characteristic of the tip extensions such that the tip extensions press outward upon lateral external surfaces in contact with respective lateral external surfaces of the tip extensions, thereby securing said screw.

5. A method of tuning components transmitting a signal of greater than 50 GHz, consisting of the steps of:

inserting a tuning screw with a compressible tip portion having at least two compressible fingers, said two compressible fingers having a compressed diameter which is small relative to the wavelength of the signal and;

adjusting said tuning screw such that the tip portions press outward upon lateral external surfaces in contact with respective lateral external surfaces of the tip portions, thereby securing said screw.

6. A tuning screw with a compressible tip for achieving tip diameters that are small relative to the wavelength of a transmitted signal, said compressible tip including at least one longitudinal slot and two compressible fingers which compress together in said tip such that tip extensions of said compressible tip press outward upon lateral external surfaces in contact with the respective lateral external surfaces of the tip extensions, thereby securing said screw.

7. A tuning screw as in claim 6, wherein said at least one slot comprises two longitudinal slots at substantially right angles to each other.

8. A tuning screw as in claim 6 wherein said tuning screw tip diameter is in the range of microwave wavelengths.

* * * * *